US012419030B2

(12) United States Patent
Yang et al.

(10) Patent No.: US 12,419,030 B2
(45) Date of Patent: Sep. 16, 2025

(54) SEMICONDUCTOR DEVICE AND METHOD OF MANUFACTURING THE SAME

(71) Applicant: Winbond Electronics Corp., Taichung (TW)

(72) Inventors: Jiun-Sheng Yang, Taichung (TW); Yi-Chin Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 455 days.

(21) Appl. No.: 17/872,696

(22) Filed: Jul. 25, 2022

(65) Prior Publication Data
US 2024/0032271 A1    Jan. 25, 2024

(51) Int. Cl.
H10B 12/00    (2023.01)

(52) U.S. Cl.
CPC .......... H10B 12/09 (2023.02); H10B 12/315 (2023.02); H10B 12/50 (2023.02)

(58) Field of Classification Search
CPC .. H10B 12/033; H10B 12/0335; H10B 12/00; H10B 12/31; H01L 28/91; H01L 23/5223; H01L 28/90
See application file for complete search history.

(56) References Cited

U.S. PATENT DOCUMENTS

| 8,188,529 | B2* | 5/2012 | Nakamura | H10B 12/09 |
| | | | | 257/306 |
| 2010/0159668 | A1* | 6/2010 | Shin | H10D 1/042 |
| | | | | 257/E21.008 |
| 2013/0077379 | A1* | 3/2013 | Matsudaira | H10B 63/30 |
| | | | | 257/E47.001 |
| 2014/0131815 | A1 | 5/2014 | Yu et al. | |
| 2015/0270271 | A1* | 9/2015 | Sakamoto | H10D 1/042 |
| | | | | 257/306 |
| 2016/0126193 | A1 | 5/2016 | Liu et al. | |
| 2022/0059540 | A1* | 2/2022 | Zhao | H10D 1/042 |
| 2022/0189869 | A1* | 6/2022 | Lee | H01L 23/5223 |

FOREIGN PATENT DOCUMENTS

JP    2010225928 A    * 10/2010

* cited by examiner

Primary Examiner — Edward Chin
(74) Attorney, Agent, or Firm — Muncy, Geissler, Olds & Lowe, P.C.

(57) ABSTRACT

A semiconductor device includes a first insulating layer over a substrate and a contact plug in the first insulating layer and in contact with the surface of the substrate. The semiconductor device further includes a capacitor structure above the contact plug and a second insulating layer on the first insulating layer and covering the capacitor structure. The capacitor structure includes a conductive layer over the first insulating layer. The semiconductor device further includes a capacitor contact over the capacitor structure. The capacitor contact includes a first contact portion and a second contact portion. The first contact portion penetrates through the second insulating layer and is in contact with the conductive layer of the capacitor structure. The second contact portion connects the outer surface of the first contact portion, and surrounds the lower portion of the first contact portion.

20 Claims, 9 Drawing Sheets

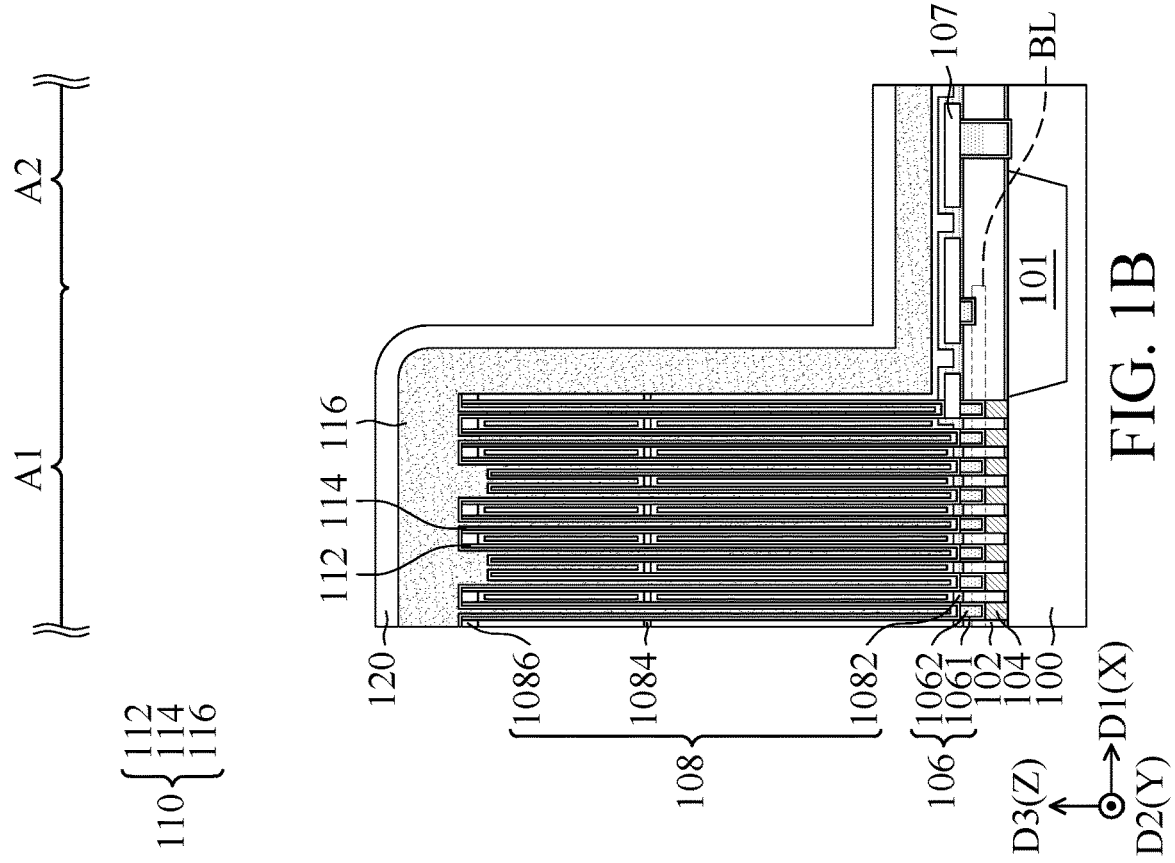
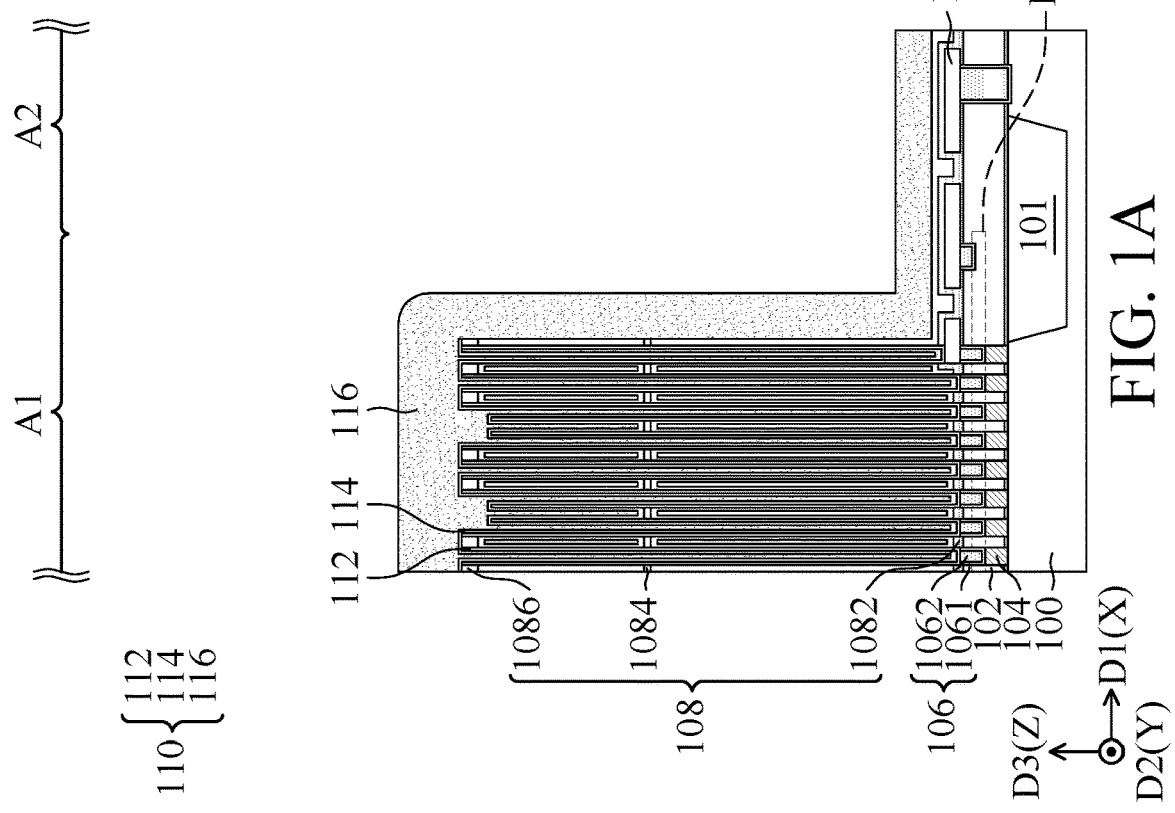

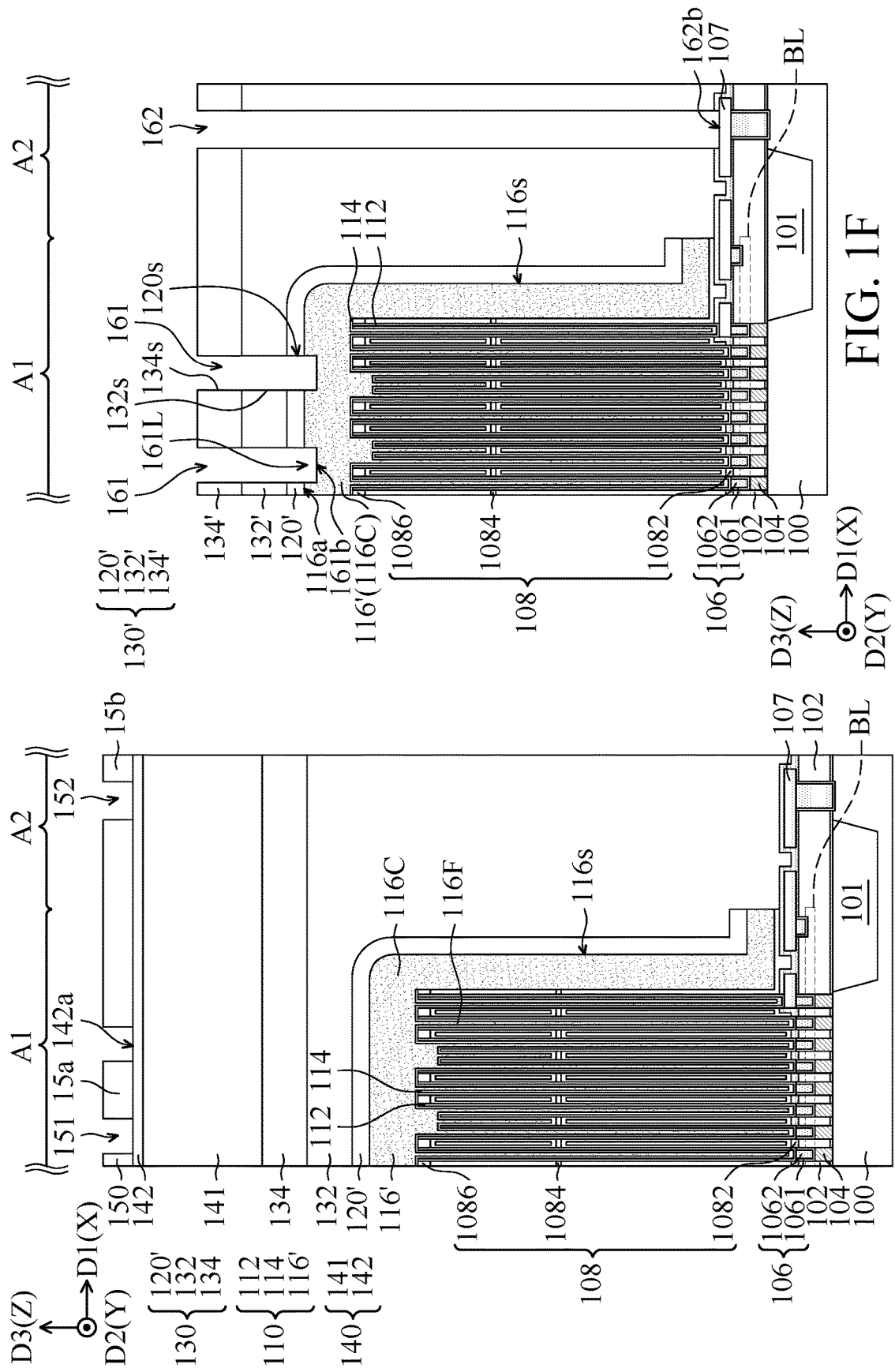

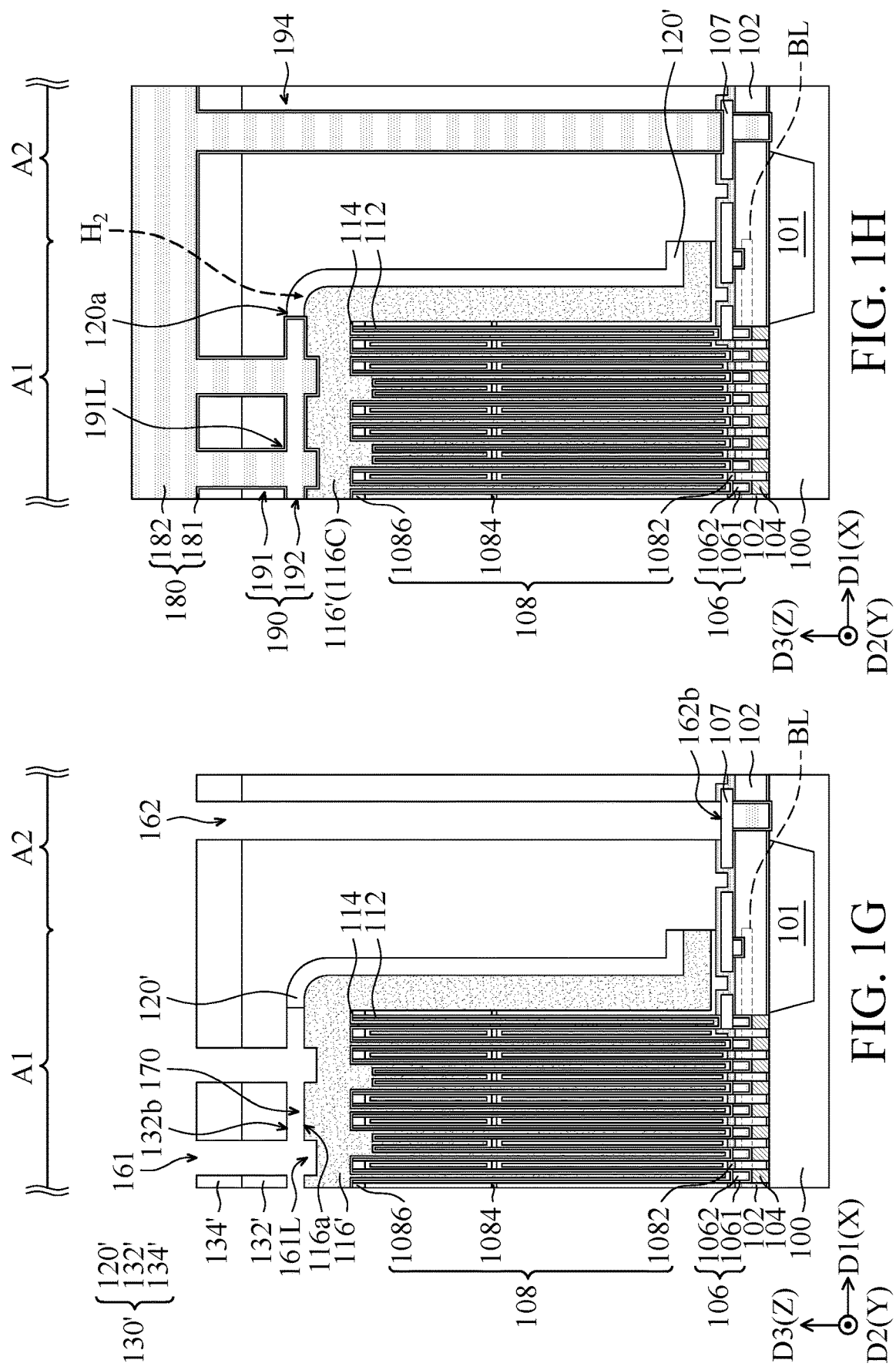

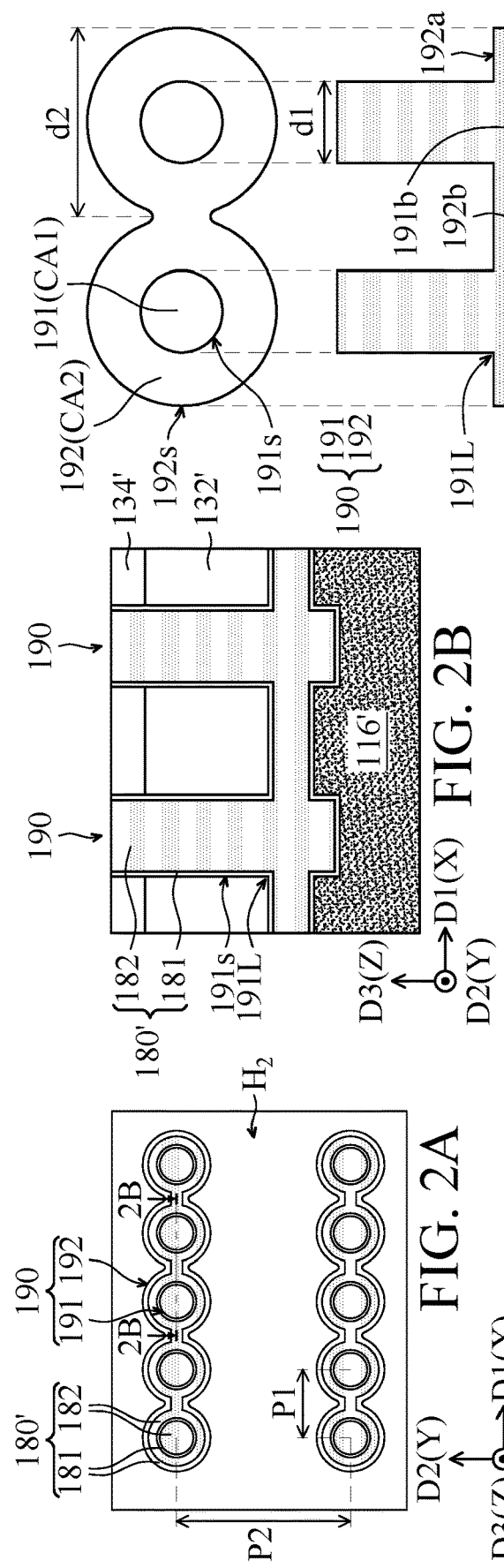
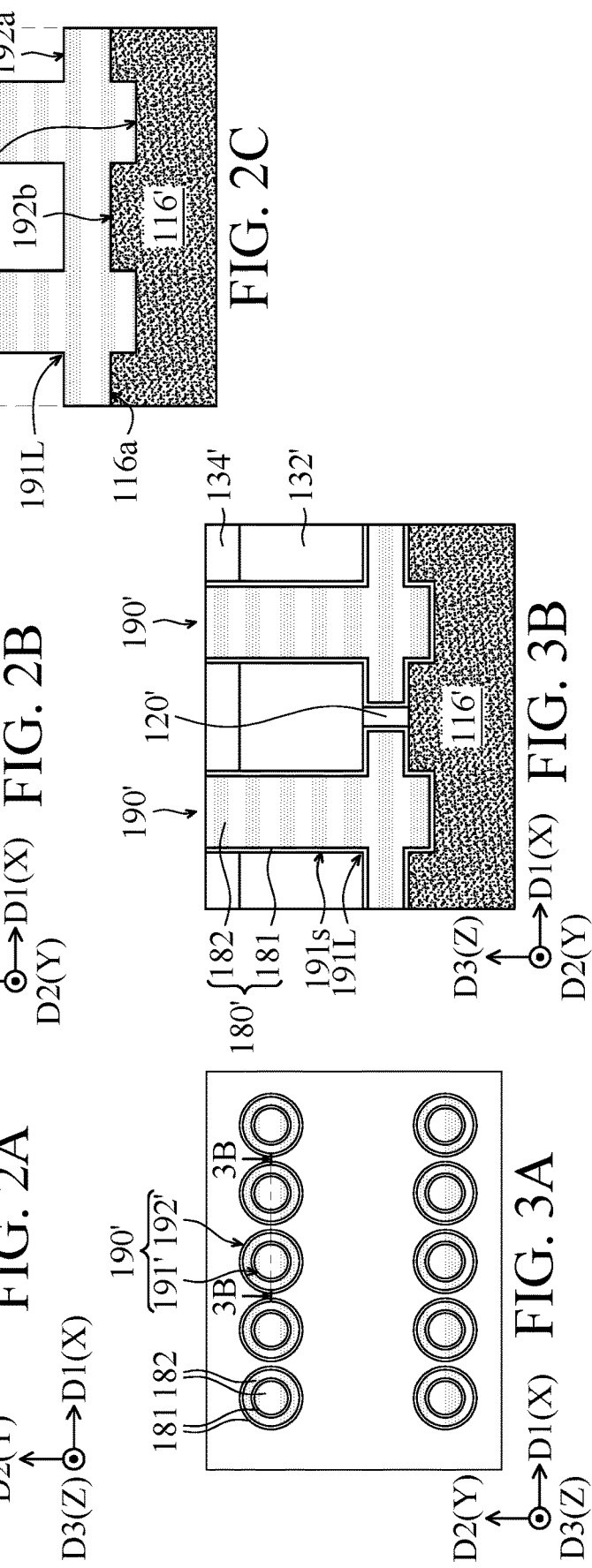

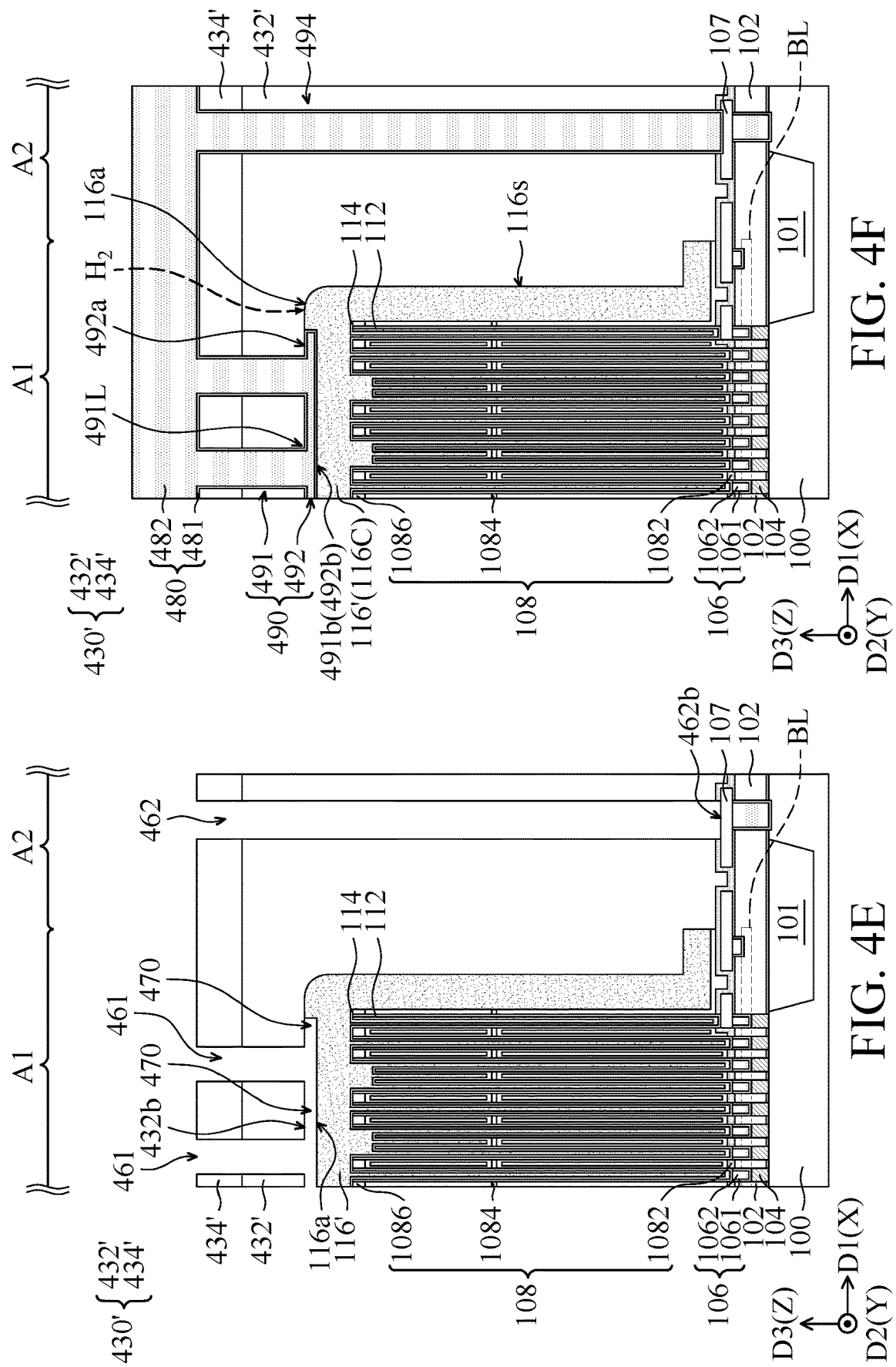

SEMICONDUCTOR DEVICE AND METHOD OF MANUFACTURING THE SAME

BACKGROUND

Technical Field

The disclosure relates to a semiconductor device and method of manufacturing the same, and it relates to a semiconductor device that includes a capacitor contact and method of manufacturing the same.

Description of the Related Art

Dynamic random access memory (DRAM) technology is widely used in consumer electronic products. In order to increase the integration density of components in DRAM and improve overall electrical performance, the current techniques used in the fabrication of DRAM continues to trend toward scaling down the components. As the components continue to shrink, many challenges arise. For example, a memory cell plate in an array region of a conventional semiconductor device may be covered by a metal layer, which reduces the resistance of a contact that is subsequently formed on the metal layer. However, the metal layer blocks the flow paths of the gas that is required to repair the process defects of the memory cell plate in the back-end-of-line (BEOL) process.

SUMMARY

Some embodiments of the present disclosure provide semiconductor devices includes a first insulating layer over a substrate, a contact plug in the first insulating layer and in contact with a surface of the substrate, a capacitor structure above the contact plug, a second insulating layer over the first insulating layer and a capacitor contact over the capacitor structure. The capacitor structure includes a conductive layer over the first insulating layer. The second insulating layer covers the capacitor structure. The capacitor contact includes a first contact portion and a second contact portion. The first contact portion penetrates through the second insulating layer and is in contact with the conductive layer of the capacitor structure. The second contact portion connects the outer surface of the first contact portion and surrounds the lower portion of the first contact portion.

Some embodiments of the present disclosure provide methods of manufacturing a semiconductor device includes providing a substrate and forming a memory cell plate over the substrate. The memory cell plate includes a first insulating layer over the substrate, a contact plug in the first insulating layer and a capacitor structure above the contact plug. The contact plug is in contact with a surface of the substrate. The capacitor structure includes a conductive layer over the first insulating layer. The method of manufacturing the semiconductor device further includes forming a second insulating layer over the first insulating layer, and the second insulating layer covers the memory cell plate. The method of manufacturing the semiconductor device further includes forming a capacitor contact over the capacitor structure. The capacitor contact includes a first contact portion and a second contact portion. The first contact portion penetrates through the second insulating layer and is in contact with the conductive layer of the capacitor structure. The second contact portion connects the outer surface of the first contact portion and surrounds the lower portion of the first contact portion.

BRIEF DESCRIPTION OF THE DRAWINGS

FIG. 1A, FIG. 1B, FIG. 1C, FIG. 1D, FIG. 1E, FIG. 1F, FIG. 1G and FIG. 1H are cross-sectional views of various fabrication stages of a semiconductor device, in accordance with some embodiments of the present disclosure.

FIG. 2A is a schematic top view of the capacitor contacts in the array region, in accordance with some embodiments of the present disclosure.

FIG. 2B is a cross-sectional view taken along sectional line 2B-2B of the structure including capacitor contacts of FIG. 2A.

FIG. 2C is a schematic diagram of a first contact portion and a second contact portion of each of the capacitor contacts, in accordance with some embodiments of the present disclosure.

FIG. 3A is a schematic top view of the capacitor contacts in the array region, in accordance with some other embodiments of the present disclosure.

FIG. 3B is a cross-sectional view taken along sectional line 3B-3B of the structure including capacitor contacts of FIG. 3A.

FIG. 4A, FIG. 4B, FIG. 4C, FIG. 4D, FIG. 4E and FIG. 4F are cross-sectional views of various fabrication stages of a semiconductor device, in accordance with some embodiments of the present disclosure.

DETAILED DESCRIPTION

Figure 1C:
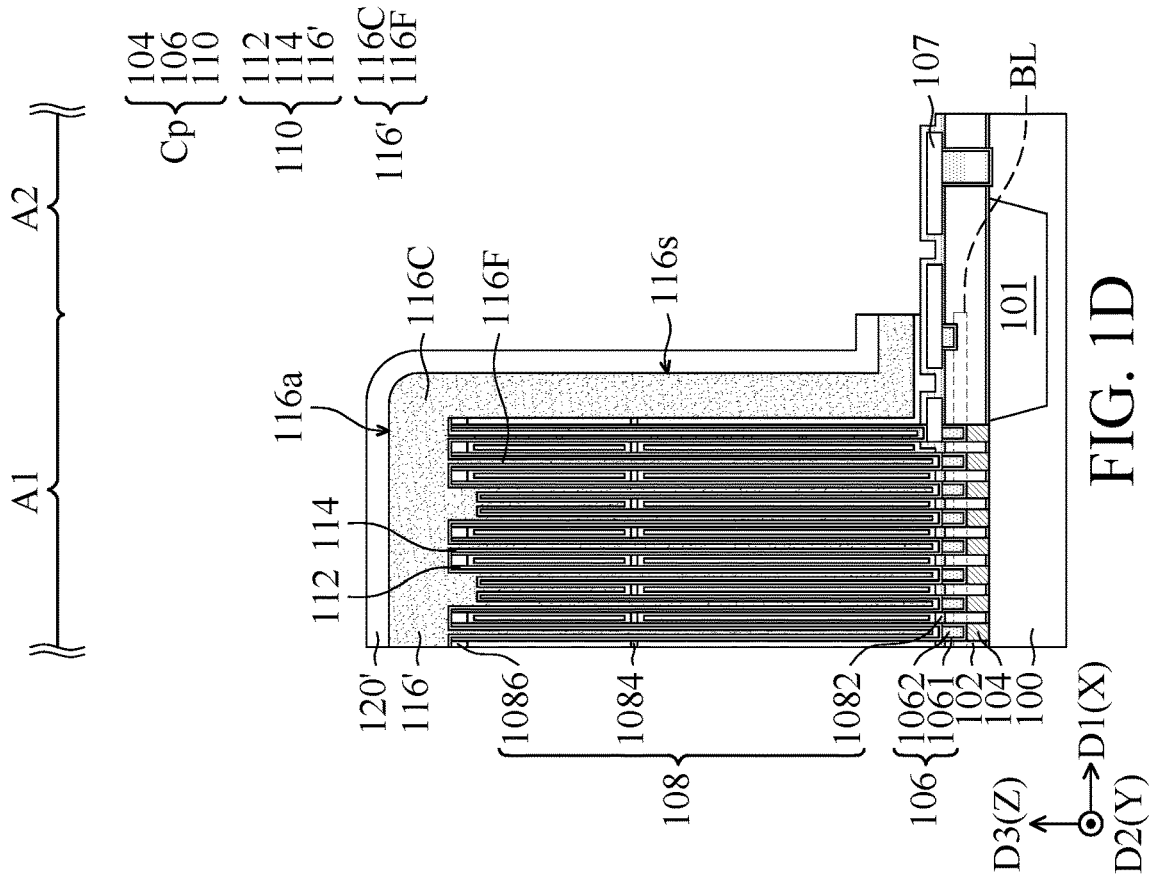

According to a semiconductor device and method of manufacturing the semiconductor device of the embodiments, a contact area between a conductive layer of a capacitor structure and a capacitor contact can be increased, so as to reduce the high resistance of the capacitor contact due to the material of the conductive layer (for example, silicon germanium material). In addition, when a hydrogen sintering process is performed, hydrogen is able to successfully passivate silicon dangling bonds at the Si-containing surface of the conductive layer of the capacitor structure, in accordance with the present disclosure. Therefore, the component defects of the semiconductor device can be repaired, so as to reduce the threshold voltage of the semiconductor device and facilitate the high-frequency operation and application of the semiconductor device.

In addition, the semiconductor device and the manufacturing method thereof are, for example, applied to a DRAM. Although the cross-sectional views of the semiconductor device, in accordance with some embodiments only show a portion of an array region (in which a portion of a memory cell plate is formed) and a portion of a peripheral region adjacent to the array region for the illustration, the present disclosure is not limited to those illustrated components.

Referring to FIG. 1A, a substrate 100 includes an array region A1 and a peripheral region A2 are provided. The substrate 100 may include a semiconductor material, such as silicon, gallium arsenide, gallium nitride, germanium silicide, another suitable material, or a combination thereof. In one embodiment, the substrate 100 is a silicon-on-insulator (SOI) substrate.

Various components may be formed in the substrate 100; for example, buried word lines (not shown), isolation structures (such as an isolation structure 101 that separates the array region A1 from the peripheral region A2, and another isolation structure (not shown) that separates the active regions in the array region A1) and bit lines BL (positioned behind the barrier structures 106 but not on the current cross section, drawn in dashed line). In addition, various components may be formed above the substrate 100. For example, contact plugs that contact active regions of the substrate 100, capacitor structures disposed on the contact plugs, and interconnection structures in the BEOL process. Some of those components that are in or above the substrate 100 are omitted in the diagrams for the sake of simplicity and clarity.

Referring to FIG. 1A, a first insulating layer 102 is formed above the substrate 100. Several contact plugs 104 formed in the first insulating layer 102 in the array region A1. The contact plugs 104 are in contact with the surface of the substrate 100 and active regions (not shown) of the substrate 100, and the contact plugs 104 corresponding to active regions (not shown). The first insulating layer 102 may be a single-layer structure or a multilayer structure. For example, the first insulating layer 102 is a double-layer structure that includes an oxide layer and a nitride layer on the oxide layer.

The contact plug 104 may be a multilayer structure. In some embodiments, the contact plug 104 includes a non-metallic conductive element, a conductive liner on the non-metallic conductive element, and a metallic conductive element on the conductive liner. Each of the contact plugs 104 is configured as a single-layer structure is shown in figures for the purpose of simplicity and clarity.

In addition, several barrier structures 106 are formed above the contact plugs 104 and in contact with the associated contact plugs 104. Subsequently, a capacitor structure is formed on each of the barrier structures 106. The area of the bottom surface of the barrier structures 106 may be equal to or greater than the area of the top surface of the contact plug 104. Accordingly, the top surface of the contact plug 104 can be completely covered by the bottom surface of the barrier structure 106 above the associated contact plug 104. Therefore, the barrier structures 106 can prevent the etchant used in the etching process from infiltrating and damaging the contact plugs 104.

The barrier structures 106 include a first barrier layer 1061 and a second barrier layer 1062. The first barrier layer 1061 covers the sidewalls and the bottom surface of the second barrier layer 1062. The first barrier layer 1061 can be made of a material with good adhesion with the first insulating layer 102. Also, the material of the first barrier layer 1061 may have good adhesion with the electrodes (such as the first electrodes 112) of the capacitor structures to be formed subsequently, so as to prevent an etchant used in the etching process form penetrating into the barrier structures 106 through the electrodes of the capacitor structures. In addition, the material of the first barrier layer 1061 can prevent the etchant from infiltrating into the substrate 100 through the gaps between the barrier structures 106 and the first insulating layer 102, thereby preventing the components in the substrate 100 from being damaged. The first barrier layer 1061 may include titanium, titanium nitride, tungsten nitride, tantalum, tantalum nitride, another suitable material, or a combination thereof. The second barrier layer 1062 may include tungsten, copper, another suitable metal materials with good electrical conductivity, or a combination thereof to provide a lower electrical resistance value.

As shown in FIG. 1A, capacitor structures 110 are formed above the contact plugs 104 in the array region A1. Specifically, the capacitor structures 110 are in contact with and disposed on the barrier structures 106. In some embodiments, the capacitor structures 110 extend in the third direction D3 (e.g. the Z-direction).

Figure 1D:
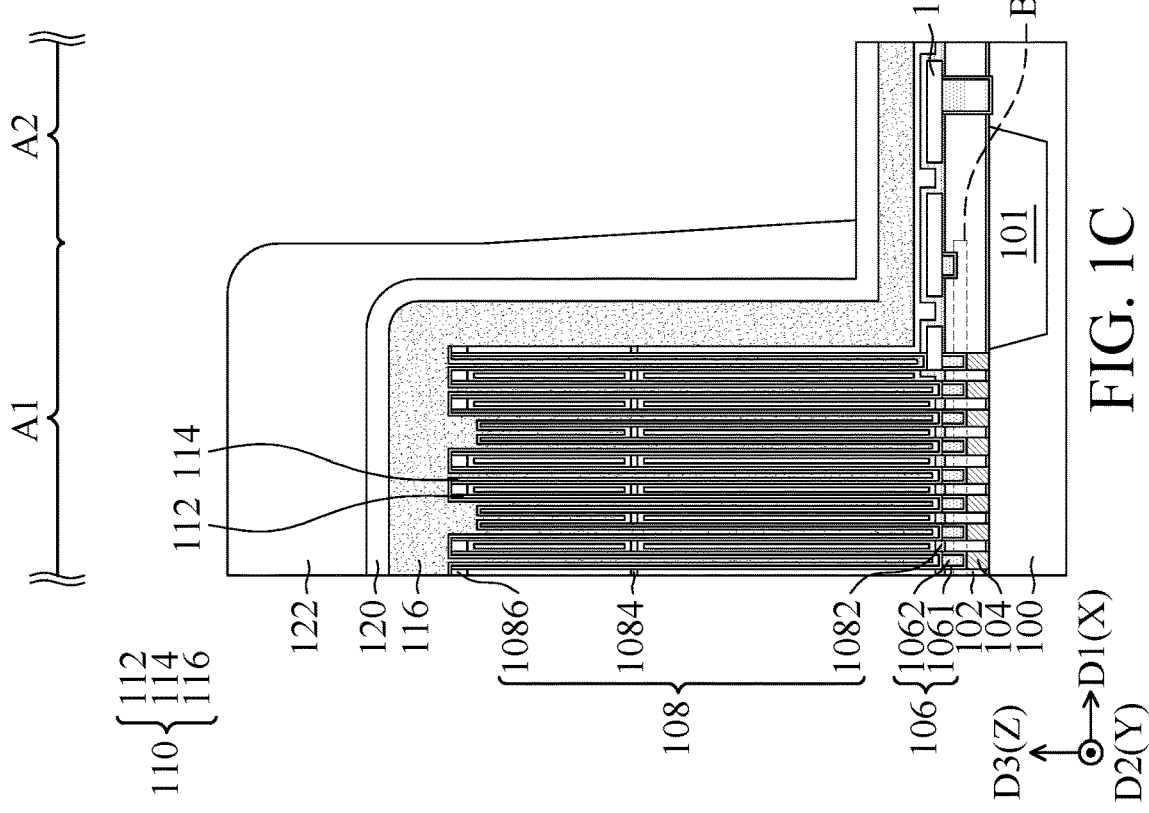

The capacitor structures 110 include first electrodes 112, a dielectric layer 114, and a conductive layer 116' (also referred to as a second electrode) (FIG. 1D). A conductive material 116 is patterned to form the conductive layer 116'. The first electrodes 112 include, for example, several independent first electrode material elements each having a U-shaped cross section. The first electrodes 112 may include titanium, titanium nitride, tantalum, tantalum nitride, tungsten nitride, another suitable conductive material, or a combination thereof. In one example, the first electrodes 112 and the first barrier layers 1061 include the same material, such as titanium nitride. The dielectric layer 114 is conformably deposited on the first electrodes 112. The dielectric layer 114 may include a dielectric material with a high dielectric constant (e.g. greater than or equal to 3.9). The conductive material 116 deposits on the dielectric layer 114 and fills the space between the dielectric layers 114. The conductive material 116 includes a conductive material with a good conductivity, such as silicon germanium, high-concentration boron-doped silicon germanium, another silicon-containing conductive material, or another conductive material.

The capacitor structures 110 further include several support members 108 for preventing the collapse of the first electrodes 112 with high aspect ratio. The support members 108 may include a plurality of bottom supports 1082, intermediate supports 1084 and top supports 1086. The support members 108 may include, for example, silicon nitride, another suitable insulating material, or a combination thereof.

As shown in FIG. 1A, in the peripheral region A2, the substrate 100 has metal contact traces 107 formed above the first insulating layer 102. In addition, bit lines BL extend from the array region A1 to the peripheral region A2 and electrically connect the metal contact traces 107.

Afterwards, the conductive material 116 is patterned, and the patterned conductive material 116' and other components form a memory cell plate on the substrate 100. According to some embodiments, a second insulating layer 130 (FIG. 1E) is formed above the first insulating layer 102 and covers the memory cell plate. The second insulating layer 130 may include a single layer or multiple layers of insulating material layers.

FIG. 1B-FIG. 1E illustrate cross-sectional views of a method for forming a second insulating layer on a memory cell plate, in accordance with some embodiments of the present disclosure. Referring to FIG. 1B, a dielectric material such as a first oxide material 120 is formed on the conductive material 116. The conductive material 116 and the first oxide material 120 form in the array region A1 and the peripheral region A2. The first oxide material 120 is, for example, but not limited to, silicon oxide. In various embodiments, the first oxide material 120 (the first oxide layer 120' subsequently formed) and the second oxide layer 132 (FIG. 1E) have different etch selectivity. By performing a deposition process, such as a physical vapor deposition (PVD) process, a chemical vapor deposition (CVD) process, an atomic layer deposition (ALD) process, another suitable process, or a combination of the aforementioned, to form the first oxide material 120. In some embodiments, by performing an oxidation process to form the first oxide material 120, for example, by thermally oxidizing the surface of the conductive material 116.

Next, a patterning process is performed on the conductive material 116 and the first oxide material 120 to define a memory cell plate $C_P$ and define the first oxide layer 120' in the array region A1.

Referring to FIG. 1C, a photoresist layer 122 covers a portion of the first oxide material corresponding to the array region A1, and exposes the remaining portion of the first oxide material 120 corresponding to the peripheral region A2.

Next, referring to FIG. 1D, an etching process is performed by using the photoresist layer 122 as a mask. The portions of the first oxide material 120 and the conductive material 116 in the peripheral region A2 are removed, and the portions of the first oxide material 120 and the conductive material 116 in the array region A1 are remained. Next, the photoresist layer 122 is removed, for example, by an ashing process or another suitable process.

As shown in FIG. 1D, the conductive layer 116' and the first oxide layer 120' are formed in the array region A1, and a memory cell plate $C_P$ is defined. The memory cell plate $C_P$ includes the contact plugs 104, the barrier structures 106 and the capacitor structures 110. The conductive layer 116' includes conductor-filled portions 116F and a covering portion 116C. The conductor-filled portions 116F fill up the spaces between the portions of the dielectric layer 114. The covering portion 116C form above the first electrodes 112 and the dielectric layer 114. The covering portion 116C may have a sufficient thickness to protect the underlying components of the capacitor structures 110 from being damaged in the subsequent processes. In some embodiments, the first oxide layer 120' is conformably formed on the surface of the conductive layer 116', for example, formed on the top surface 116a and the lateral surface 116s of the conductive layer 116'.

The structure illustrated in FIG. 1D can also be obtained by using another method. In some embodiments, a patterning process can be performed on the structure illustrated in FIG. 1A. For example, a mask is provided on the structure in FIG. 1A, and then the portion of the conductive material 116 in the peripheral region A2 that is not covered by the mask are removed. The portion of the conductive material 116 in the array region A1 is remained, so as to form a memory cell plate $C_P$ including the conductive layer 116'. Next, a pretreatment, such as a thermal oxidation process, is performed on the conductive layer 116' to form a first oxide layer 120' conformably on the surface of the conductive layer 116'.

Referring to FIG. 1E, a second oxide layer 132 is formed over the first oxide layer 120'. The second oxide layer 132 may include silicon oxide or another suitable oxide material. In some embodiment, the second oxide layer 132 is a tetraethyl orthosilicate (TEOS) layer. The formation method of the second oxide layer 132 may include, for example, depositing an oxide material layer in the array region A1 and the peripheral region A2 by performing PVD process, CVD process, an ALD process, spin coating, another suitable process, or a combination of the aforementioned processes. Then, the oxide material layer can be polished by performing, for example, a chemical mechanical polishing process, so as to planarize the top surfaces of the oxide material layers in the array region A1 and the peripheral region A2.

In some embodiments, the second insulating layer 130 further includes a third oxide layer 134 formed above the second oxide layer 132. The material and formation method of the third oxide layer 134 may similar to that of second oxide layer 132.

Next, several contact holes form in the second insulating layer 130 by performing an etching process. In one embodiment, a plurality of contact holes are simultaneously formed in the second insulating layer 130 in the array region A1 and the peripheral region A2.

As shown in FIG. 1E, a pattern transfer layer 140 is formed over the second insulating layer 130. The pattern transfer layer 140 may include a multilayer material stack, and may be formed by PVD process, CVD process, ALD process, spin coating, another suitable process, or a combination of the aforementioned processes. In some embodiments, the pattern transfer layer 140 includes a carbon-containing layer 141 and an anti-reflective layer 142 sequentially formed over the third oxide layer 134. The carbon-containing layer 141 may include carbides, such as a diamond-like carbon film, an amorphous carbon film, a transparent carbon-containing layer. In one embodiment, the carbon-containing layer 141 is a spin-on carbon layer. The anti-reflective layer 142 may include a single layer or multiple layers of materials. The anti-reflective layer 142 includes, for example, organic polymers, carbon, silicon oxynitride, silicon oxide, another suitable material, or a combination of the aforementioned materials. In one embodiment, the anti-reflective layer 142 includes an oxygen-rich silicon oxynitride layer and a silicon oxide layer.

Next, a patterned mask layer 150 is provided over the pattern transfer layer 140. The patterned mask layer 150 includes mask patterns 15a and 15b that are formed on the anti-reflective layer 142 in the array region A1 and the peripheral region A2, respectively. The mask pattern 15a and 15b include the openings 151 and 152 respectively. The openings 151 and 152 expose parts of the top surface 142a of the anti-reflective layer 142 of the pattern transfer layer 140.

Referring to FIG. 1F, the portions of the pattern transfer layer 140 that are not covered by the patterned mask layer 150 are removed by using the patterned mask layer 150 as a mask. In one embodiment, the portions of the anti-reflective layer 142 exposed by the openings 151 and 152 and the corresponding portions of the carbon-containing layer 141 are removed by performing dry etching. Next, the pattern of the patterned mask layer 150 is transferred to the pattern transfer layer 140, thereby forming a patterned pattern transfer layer includes a patterned anti-reflective layer (not shown) and a patterned carbon-containing layer (not shown).

Next, the patterned mask layer 150 can be removed by performing ashing process, etching process, or another suitable removing process. The second insulating layer 130 below the patterned pattern transfer layer is then etched by using the patterned pattern transfer layer as a mask to remove portions of the first insulating layer 130 for forming several contact holes. Next, the patterned pattern transfer layer is removed.

Specifically, the first contact holes 161 and the second contact hole 162 form in the second insulating layer 130 in the array region A1 and the peripheral region A2 respectively. The first contact holes 161 extend along the third direction D3 and penetrate through the third oxide layer 134, the second oxide layer 132 and the first oxide layer 120' to reach the conductive layer 116' of the memory cell plate $C_P$. That is, the bottom surfaces 161b of the first contact holes 161 expose the covering portion 116C of the conductive layer 116'.

The conductive layer 116' functions as an etch stop layer, so that the bottom surfaces 161b of the first contact holes 161 and the top surface 116a of the conductive layer 116' are substantially coplanar (not shown in the drawings). In some embodiments, the conductive layer 116' is slightly etched, so that the bottom surfaces 161b of the first contact holes 161 are slightly lower than the top surface 116a of the conductive layer 116'. After removing the patterned pattern transfer layer, the sidewalls 134s of the remaining third oxide layer 134', the sidewalls 132s of the remaining second oxide layer 132' and the sidewalls 120s of the remaining first oxide layer 120' expose in the first contact holes 161.

In addition, the second contact hole 162 extends in the third direction D3 and penetrates through the third oxide layer 134 and the second oxide layer 132 to reach the metal contact traces 107 (such as metal layer M0) in the peripheral region A2. The bottom surface 162b of the second contact hole 162 exposes the metal contact trace 107. In addition, the first contact holes 161 and the second contact hole 162 are separated from each other in the first direction D1. There is a distance between the second contact hole 162 and the lateral surface of the memory cell plate $C_P$ (i.e., the lateral surface 116s of the conductive layer 116').

Referring to FIG. 1G, a selective etching process such as a wet etching process is performed through the first contact holes 161. Portions of the first oxide layer 120 is removed from the first contact hole 161, thereby forming air cavities 170 outwardly from the lower portions 161L of the first contact holes 161. The air cavities 170 surround and connect with the lower portions 161L of the first contact holes 161. The air cavities 170 expose the bottom surface 132b of the second oxide layer 132' and the top surface 116a of the conductive layer 116'. The etchant may include diluted hydrofluoric acid or another suitable chemical. The amount of the removed portions of the first oxide layer 120' can be controlled by adjusting the etching time and/or the concentration of the etchant. Compared with the conventional process that only forms through holes (such as the first contact holes 161) that extend downwardly, the embodiments of the present disclosure can further form air cavities 170 extend outwardly and recess the sidewalls of the first contact holes 161. In the subsequent process, the first contact holes 161 and the air cavities 170 are filled with conductive material(s) to form capacitor contacts, so that the contact area between the memory cell plate $C_P$ and each of the capacitor contact can be increased, thereby reducing the resistance of the capacitor contact. In addition, the closer the adjacent first contact holes 161 are, the easier the air cavities 170 formed around the respective contact holes are connected to each other, so that the conductive materials subsequently filled in the air cavities 170 are more easily to be connected to each other.

The first oxide layer 120' and second oxide layer 132 have different etch selectivity. In one embodiment, the etch rate of the first oxide layer 120' is greater than the etch rate of the second oxide layer 132, for example, the etching ratio of the first oxide layer 120' to the second oxide layer 132 is at least 2:1. Therefore, the second oxide layer 132 is not removed or only a small amount of the second oxide layer 132 is removed. In one embodiment, the first oxide layer 120' is deposited by an ALD process and the material of the second oxide layer 132 is TEOS, the etch rate of the first oxide layer 120' to the second oxide layer 132 is about 2:1. In addition, the portions of the ALD oxide can be removed by a diluted hydrofluoric acid, thereby forming the air cavities 170.

Referring to FIG. 1H, a conductive composite material 180 is formed above the patterned second insulating layer 130', to fill in the first contact holes 161, the air cavities 170 and the second contact hole 16. The conductive composite material 180 may include a liner layer 181 and a conductive material layer 182. The liner layer 181 can be deposited in the first contact holes 161, the air cavities 170 and the second contact hole 162, and then a conductive material layer 182 is deposited over the patterned second insulating layer 130' to fill the remaining spaces in the first contact holes 161, the air cavities 170 and the second contact hole 162. The liner layer 181 may include titanium, titanium nitride, tungsten nitride, tantalum, tantalum nitride, another suitable material, or a combination of the aforementioned material. The conductive material layer 182 may include tungsten, copper, another suitable metal material with good conductivity, or a combination of the aforementioned material, which have lower resistance value.

Next, the portions of the conductive material layer 182 and the liner layer 181 exceed the top surface of the patterned second insulating layer 130' are removed by performing CMP, etch back, or a combination of the aforementioned methods. The remaining portions of the conductive composite material 180' (FIG. 2B) form contacts. Therefore, capacitor contacts (also referred to as first contacts) 190 are formed in the array region A1, and contacts (also referred to as second contacts) 194 connected to the metal contact traces 107 are formed in the peripheral region A2. Next, other known processes (such as formation of an interconnect structure in the peripheral region) may be performed to complete other components required for the semiconductor device.

FIG. 2A is a schematic top view of the capacitor contacts 190 in the array region A1, in accordance with some embodiments of the present disclosure. FIG. 2B is a cross-sectional view taken along sectional line 2B-2B of the structure including capacitor contacts of FIG. 2A. FIG. 2C is a schematic diagram of a first contact portion and a second contact portion of each of the capacitor contacts, in accordance with some embodiments of the present disclosure.

Referring to FIG. 1H and FIG. 2A, the capacitor contacts 190 covers a portion of the top surface of the conductive layer 116', while the remaining portions of the top surface of the conductive layer 116' are not covered by the capacitor contacts 190. Therefore, when a hydrogen sintering process is performed, hydrogen is able to successfully reach and repair dangling bonds at the Si-containing material underlying of the conductive layer 116', thereby improving electrical performance of a semiconductor.

Referring to FIG. 2A, FIG. 2B and FIG. 2C, the capacitor contacts 190 includes a first contact portion 191 and a second contact portion 192. The first contact portion 191 includes the conductive composite material 180' (including the liner layer 181 and the conductive material layer 182) in the first contact hole 161. The second contact portion 192 includes the conductive composite material 180' in the air cavity 170. FIG. 2C shows a top view and a cross-sectional view of the first contact portions 191 and the second contact portions 192. In order to show the relative positions of the first contact portion 191 and the second contact portion 192 more clearly, FIG. 2C only depicts the first contact portion 191 and the second contact portion 192 that are respectively formed by a single-layer conductive composite material 180'.

The capacitor contacts 190 form in the second insulating layer 130 and contact the covering portion 116C of the conductive layer 116' of the capacitor structure 110. Specifically, the first contact portions 191 penetrate through the second insulating layer 130, and electrically connect to the conductive layer 116' of the capacitor structure 110. The second contact portions 192 connect to the outer surface 191s of the first contact portions 191 and surrounds the lower portions 191L of the first contact portions 191.

Referring to FIG. 2C, as viewed from the top of the substrate 100, the area CA2 surrounded by the sidewall 192s of the second contact portion 192 is larger than the area CA1 surrounded by the sidewall 191s of the first contact portion 191. The first contact portions 191 are, for example, circular or approximately circular. The second contact portions 192 surround the first contact portions 191, wherein the diameter d2 of the area CA2 is larger than the diameter d1 of the area CA1. In some embodiments, the first contact portions 191 and the respective second contact portions 192 are arranged in a concentric configuration.

In some other embodiments, as viewed from the top of the substrate 100, the capacitor contacts 190 may also be configured in other shapes, such as an ellipse, a regular polygon (for example, a square or a regular hexagon) or an irregular polygon (a quadrilateral or a hexagon), or another shape.

In some embodiments, the conductive layer 116' may be slightly etched during the formation of the first contact holes 161. Thus, the bottom surfaces 191b of the first contact portions 191 may be lower than the top surface 116a of the conductive layer 116' and the bottom surfaces 192b of the second contact portions 192. That is, the bottom surfaces 191b of the first contact portions 191 are misaligned rather than coplanar with the bottom surfaces 192b of the second contact portions 192. In other embodiments, the conductive layer 116' is not substantially etched, the bottom surfaces 191b of the first contact portions 191 are substantially coplanar with the top surface 116a of the conductive layer 116'.

In some embodiments, the top surfaces 192a of the second contact portions 192 are substantially coplanar with the top surface 120a of the first oxide layer 120'. The second contact portions 192 form over the conductive layer 116', so that the top surfaces 192a of the second contact portions 192 are higher than the top surface 116a of the conductive layer 116'.

Referring to FIG. 2A, FIG. 2B and FIG. 2C, the capacitor contacts 190 are arranged in several rows. There is a first pitch P1 between two adjacent first contact portions 191 arranged in the same row. There is a second pitch P2 between two adjacent first contact portions 191 arranged in different rows. The first pitch P1 is less than the second pitch P2. In addition, the second contact portions 192 in the same row can connect to each other.

In other embodiments, as shown in FIG. 3A and FIG. 3B, the amount of the removing portions of the first oxide layer 120 can be controlled by adjusting the selective etching process (FIG. 1G), so that adjacent air cavities 170 around the respective first contact holes 161 are not connected to each other. In one embodiment, the second contact portions 192' of adjacent capacitor contacts 190' are separated from each other by a distance.

In other embodiment, the capacitor contacts can be fabricated by another method. The components in FIG. 4A-FIG. 4F similar or identical to that in FIG. 1A-FIG. 1H are designated with similar or the same reference numbers, and the details are not repeated herein.

According to the method as illustrated in FIG. 1A-FIG. 1H, the air cavities 170 are formed in the first oxide layer 120'. In an alternative method as illustrated in FIG. 4A-FIG. 4F, the air cavities 470 are formed in the conductive layer 116', and the second contact portions 492 of the capacitor contacts are subsequent formed after a conductive material is filled in the air cavities 470.

Figure 4A:
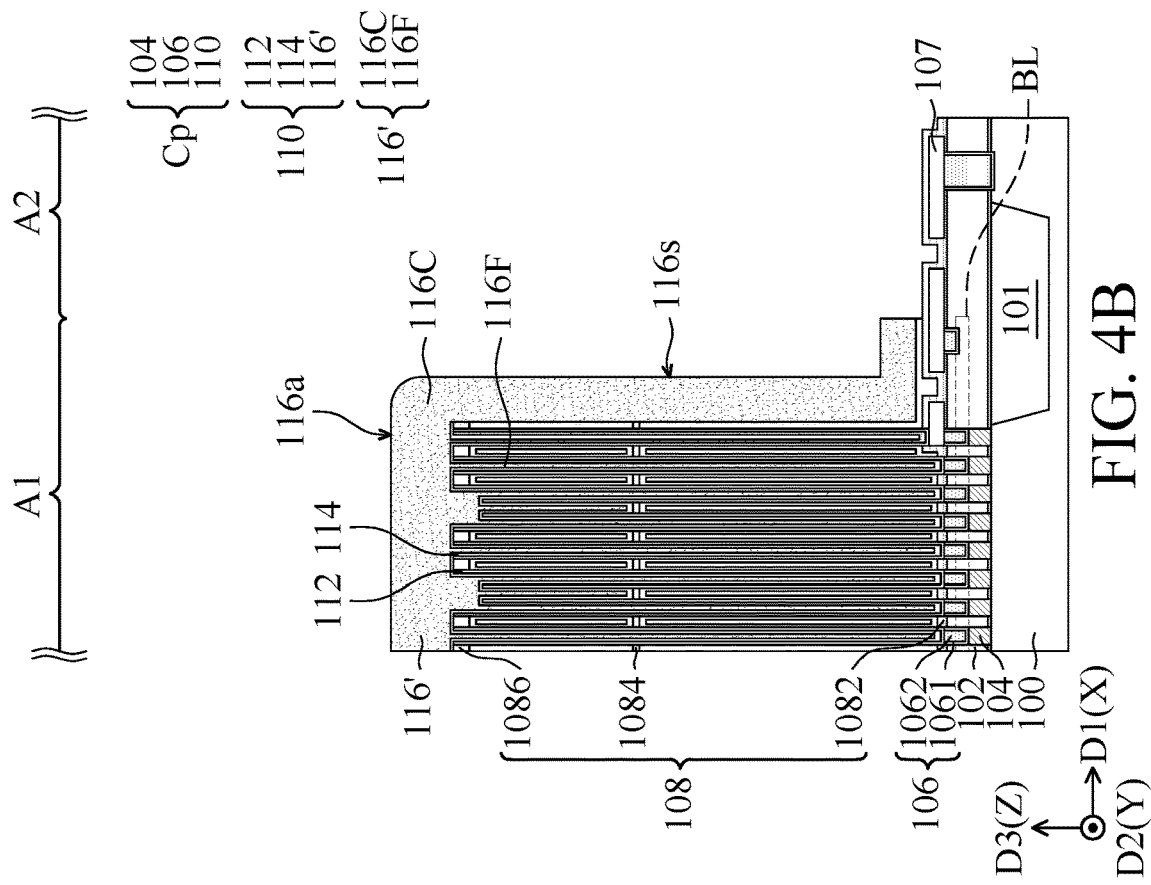

Referring to FIG. 4A, the structure shown in FIG. 1A is provided. Then, a photoresist layer 422 is formed to cover the conductive material 116 in the array region A1, and expose the conductive material 116 in the peripheral region A2.

Figure 4B:
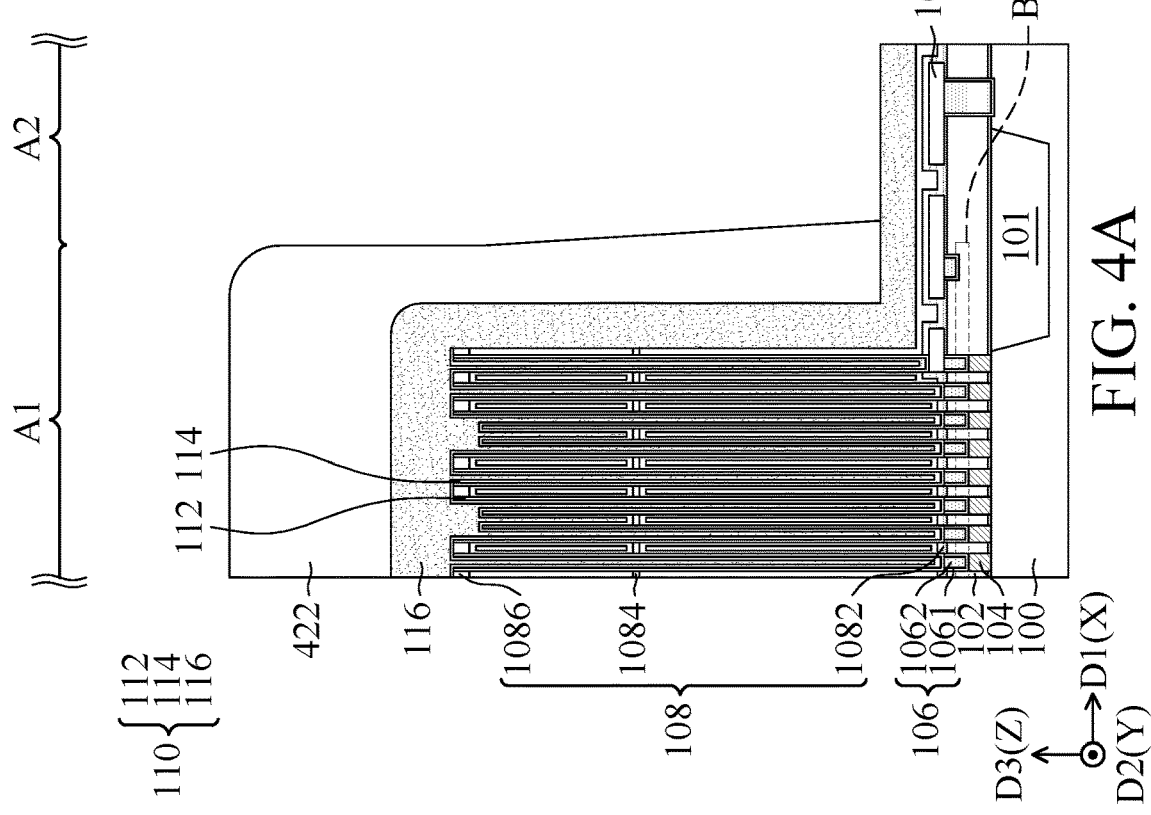

Referring to FIG. 4B, the photoresist layer 422 is used as a mask, and the conductive material 116 in the peripheral region A2 is removed. Next, the photoresist layer 422 is removed and the conductive layer 116' is formed. A memory cell plate $C_P$ defines in the array region A1.

Figures 4C, 4D:
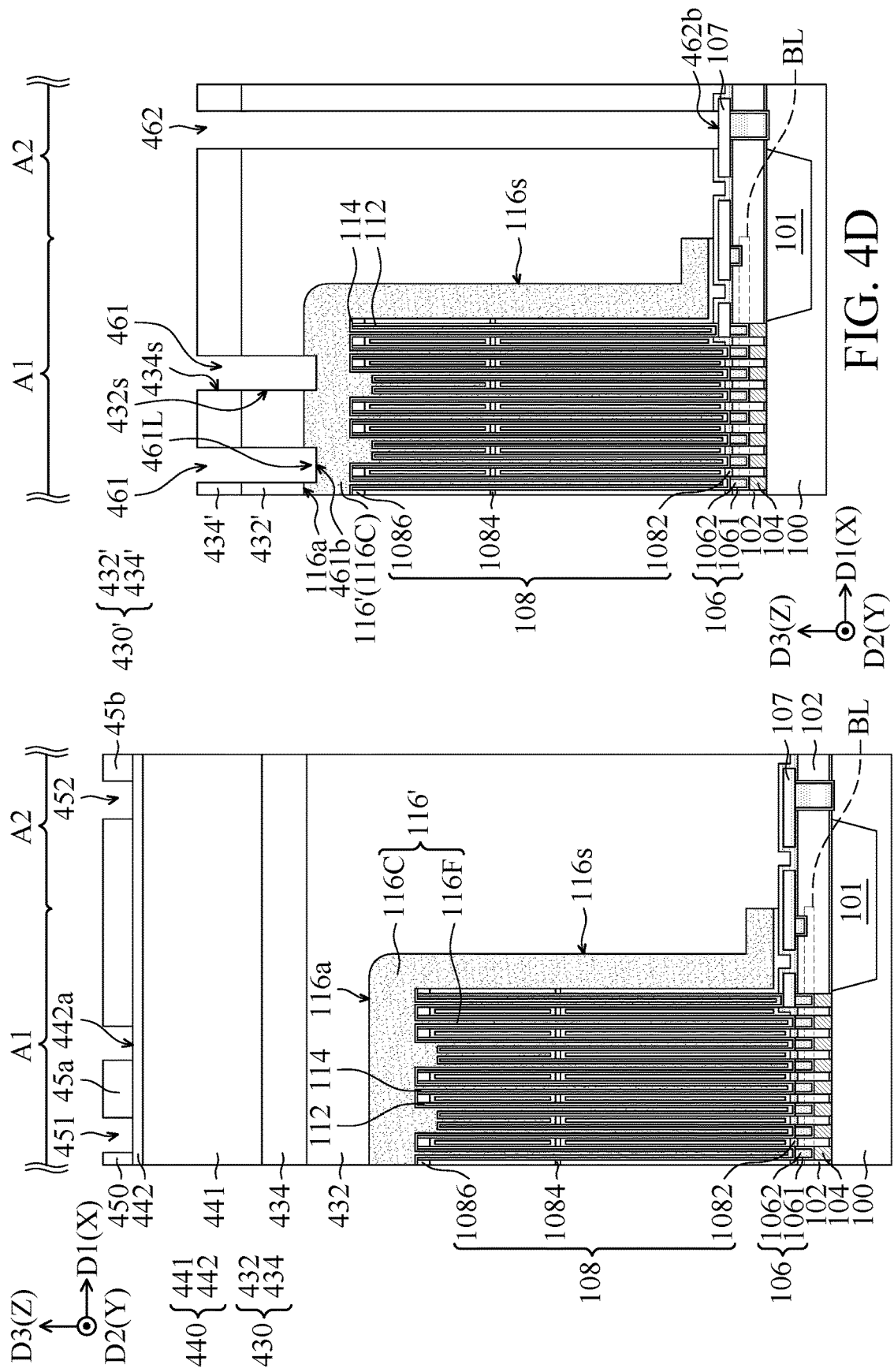

Referring to FIG. 4C, a second insulating layer 430 is formed over the first insulating layer 102 to cover the memory cell plate $C_P$ in the array region A1 and various components such as the metal contact traces 107 in the peripheral region A2. The second insulating layer 430 may include a first oxide layer 432 and a second oxide layer 434. The first oxide layer 432 is conformably formed on the surfaces (i.e. the top surface 116a and the lateral surface 116s) of the conductive layer 116'. The material of first oxide layer 432 may include TEOS, and the second oxide layer 434 may include silicon oxide or another suitable material. The forming method of the first oxide layer 432 and the second oxide layer 434 may be same as that of the first oxide layer 132 and the second oxide layer 134, respectively.

Next, contact holes form in the second insulating layer 430 by using a mask and a suitable etching process. In one embodiment, contact holes simultaneously form in the second insulating layer 430 in the array region A1 and the peripheral region A2

As shown in FIG. 4C, a pattern transfer layer 440 is formed over the second insulating layer 430. The pattern transfer layer 440 includes a carbon-containing layer 441 and an anti-reflective layer 442 sequentially formed over the second oxide layer 434. The carbon-containing layer 441 may be a spin-on carbon layer, and the anti-reflective layer 442 may be a double-layer structure including an oxygen-rich silicon oxynitride layer and a silicon oxide layer (FIG. 4C only shows a single-layer structure).

Next, a patterned mask layer 450 (such as a patterned photoresist layer) is provided over the pattern transfer layer 440 and exposes portion of the top surface of the pattern transfer layer 440. The patterned mask layer 450 includes mask patterns 45a and 45b formed on the anti-reflection layer 442 in the array region A1 and the peripheral region A2, respectively. The mask pattern 45a 45b includes the openings 451 and 452 which expose parts of the top surface 442a of the anti-reflective layer 442.

Next, the portions of the pattern transfer layer 440 that are not covered by the patterned mask layer 450 are removed. In one embodiment, the portions of the anti-reflective layer 442 exposed by the openings 451 and 452 and the corresponding portions of the carbon-containing layer 441 are removed, for example, by dry etching. Next, the pattern of the patterned mask layer 450 is transferred to the pattern transfer layer 440, thereby forming a patterned pattern transfer layer that includes a patterned anti-reflective layer (not shown) and a patterned carbon-containing layer (not shown). Next, the patterned mask layer 450 can be removed.

Referring to FIG. 4D, the second insulating layer 430 is etched by using the patterned pattern transfer layer as a mask to form several contact holes. Portions of the second oxide layer 434' and the first oxide layer 432' remain on the conductive layer 116'. Next, the patterned pattern transfer layer is removed.

As shown in FIG. 4D, the first contact holes 461 and the second contact hole 462 form in the second insulating layer 430 in the array region A1 and the peripheral region A2. The first contact holes 461 extend along the third direction D3 and penetrate through the second oxide layer 434 and the first oxide layer 432 to reach the conductive layer 116' of the memory cell plate $C_P$. That is, the bottom surfaces 461*b* of the first contact holes 461 expose the covering portion 116C of the conductive layer 116'.

In addition, the conductive layer 116' functions as an etch stop layer to stop the first contact holes 461 on the conductive layer 116', so that the bottom surfaces 461*b* of the first contact holes 461 and the top surface 116*a* of the conductive layer 116' are substantially coplanar (not shown in the drawings). In some embodiments, the conductive layer 116' is slightly etched, so as to remove small amounts of the conductive layer 116'. Therefore, the bottom surfaces 461*b* of the first contact holes 461 are slightly lower than the top surface 116*a* of the conductive layer 116'. After removing the patterned pattern transfer layer, the sidewalls 434*s* of the remaining second oxide layer 434' and the sidewalls 432*s* of the remaining first oxide layer 432' expose in the first contact holes 461.

The second contact hole 462 extends in the third direction D3 and penetrates through the second oxide layer 434 and the first oxide layer 432 to reach the metal contact traces 107 in the peripheral region A2. The bottom surface 462*b* of the second contact hole 462 exposes the metal contact trace 107. In addition, the first contact holes 461 and the second contact hole 462 are separated from each other in the first direction D1. The second contact hole 462 is separated from the lateral surface of the memory cell plate $C_P$ (i.e., the lateral surface 116*s* of the conductive layer 116') by a distance.

Referring to FIG. 4E, a selective etching process is performed through the first contact holes 461 to remove portions of the conductive layer 116', and air cavities 470 are formed outwardly from the lower portions 461L of the first contact holes 461. The air cavities 470 surround and connect with the lower portions 461L of the first contact holes 461. The selective etching process is, for example, a wet etching process, which can isotropic remove portions of the conductive layer 116' from the first contact hole 461, so that the air cavities 470 expose the bottom surface 432*b* of the first oxide layer 432' and the top surface 116*a* of the conductive layer 116'. In some embodiments, the conductive layer 116' includes silicon germanium, and the etchant is, for example, ammonia water or another suitable chemical. Similar to the aforementioned embodiment, when the first contact holes 461 and the air cavities 470 are filled with a conductive composite material to form the capacitor contacts, the contact area between the capacitor contacts and the memory cell plate $C_P$ can be increased, thereby reducing the resistances of the capacitor contacts.

Referring to FIG. 4F, a conductive composite material 480 form above the patterned second insulating layer 430' and fill in the first contact holes 461, the air cavities 470 and the second contact hole 462. The conductive composite material 480 may include a liner layer 481 and a conductive material layer 482.

Next, the excess portions of the conductive material layer 482 and the liner layer 481 above the top surface of the patterned second insulating layer 430' are removed by, for example, CMP, etch back, or a combination of the aforementioned methods. The remaining portions of the conductive composite material 480' (FIG. 5B) form contacts. In some embodiments, capacitor contacts (also referred to as first contacts) 490 form in the array region A1, and contacts (also referred to as second contacts) 494 connected to the metal contact traces 107 form in the peripheral region A2. The capacitor contacts 490 includes a first contact portion 491 and a second contact portion 492 that surrounds the lower portion 491L of the first contact portion 491.

Figure 5B:
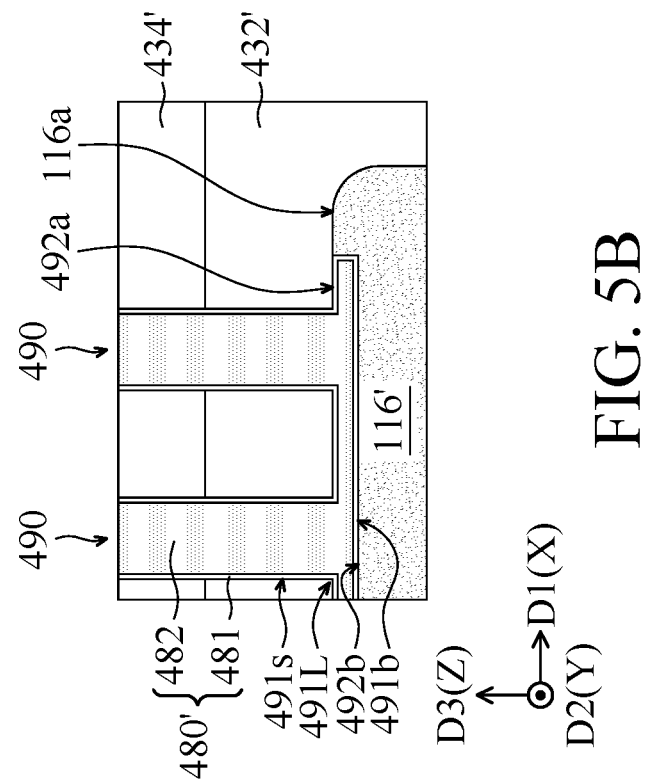
FIG. 5B is a cross-sectional view taken along sectional line 5B-5B of the structure including capacitor contacts of FIG. 5A.
Figure 5A:
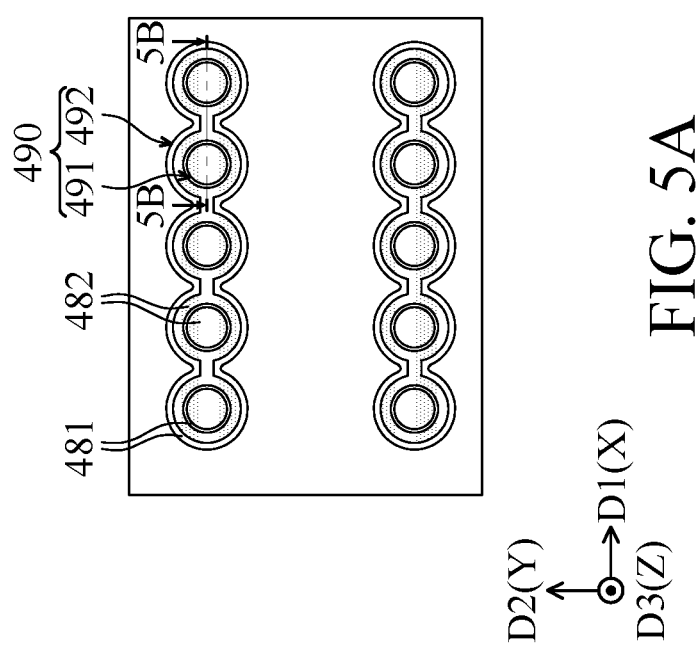
FIG. 5A is a schematic top view of the capacitor contacts in the array region, in accordance with some embodiments of the present disclosure.

FIG. 5A is a schematic top view of capacitor contacts 490 in the array region A1. FIG. 5B is a cross-sectional view taken along sectional line 5B-5B of the structure including capacitor contacts of FIG. 5A. Although the second contact portions 492 of the capacitor contacts 490 shown in FIG. 4E, FIG. 4F, FIG. 5A and FIG. 5B are connected to each other, the present disclosure is not limited thereto. In some other embodiments, the amount of the removing portions of the conductive layer 116' can be controlled by adjusting the selective etching process (FIG. 4E), so that adjacent air cavities 470 around the respective first contact holes 461 are not connected to each other.

Referring to FIG. 4F and FIG. 5A, only parts of the top surface of the conductive layer 116' are covered by the capacitor contacts 490. Therefore, when $H_2$ sintering process is performed, hydrogen is able to successfully reach and repair dangling bonds at the Si-containing material underlying of the conductive layer 116'.

Referring to FIG. 4E, FIG. 4F, FIG. 5A and FIG. 5B, the capacitor contacts 490 includes a first contact portion 491 and a second contact portion 492. The first contact portion 491 includes a portion of the conductive composite material 480' (including the liner layer 481 and the conductive material layer 482) in the first contact hole 461. The second contact portion 492 includes the other portion of the conductive composite material 480' in the air cavity 470.

The capacitor contacts 490 form between the second insulating layer 430 and a portion of the conductive layer 116'. The first contact portions 491 penetrate through the second insulating layer 430 and a portion of the conductive layer 116'. Therefore, the capacitor contacts 490 contact and electrically connect the covering portion 116C of the conductive layer 116' of the capacitor structure 110. The second contact portions 492 of the capacitor contacts 490 connect to the outer surface 491*s* of the first contact portions 491 and surrounds the lower portions 491L of the respective first contact portions 491.

Referring to FIG. 5A, as viewed from the top of the substrate 100, the area surrounded by the sidewall of the second contact portion 492 is greater than the area surrounded by the sidewall of the first contact portion 491. The first contact portions 491 and the second contact portions 492 are, for example, circular or another shape. In some embodiments, the second contact portions 492 surround the first contact portions 491. In some embodiments, the first contact portions 491 and the second contact portions 492 are arranged in a concentric configuration.

In some embodiments, an isotropic etching process is performed on the conductive layer 116' exposed at the lower portions of the first contact holes 461 to form the air cavities 470. Therefore, after the capacitor contacts 490 are formed, the bottom surfaces 491*b* of the first contact portions 491 are lower than the top surface 116*a* of the conductive layer 116' and are substantially coplanar with the bottom surfaces 492*b* of the second contact portions 492. That is, the second contact portions 492 are formed in the conductive layer 116'. In some embodiments, the top surfaces 492*a* of the second contact portions 492 are substantially coplanar with the top surface 116*a* of the conductive layer 116'.

According to the aforementioned descriptions, the semiconductor device and the manufacturing methods thereof are provided. The capacitor contacts of the embodiment do not fully cover the memory cell plate. Therefore, when a hydrogen sintering process is performed, hydrogen is able to reach the second insulating layer and a portion of the conductive layer (including such as silicon germanium material) that is in direct contact with the second insulating layer. Thus, hydrogen is able to repair dangling bonds at the Si-containing material, thereby repairing the process defects and improving the electrical performance of a semiconductor device. For example, the threshold voltage of the semiconductor device can be reduced. In some embodiments, among the capacitor contacts that are connected to the capacitor structure, the first contact portions of the capacitor contacts penetrate through the insulating layer and are in contact with the underlying conductive layer, while the second contact portions surrounds the bottoms of the respective first contact portions. Therefore, the contact area between the capacitor contacts and the conductive layer of the capacitor structure can be increased, so as to reduce the high resistance of the capacitor contacts caused by the material of the conductive layer (e.g., silicon germanium material). In addition, the methods of manufacturing the semiconductor device, in accordance with some embodiments of the present disclosure, do not include complicated and expensive manufacturing processes, which save production time for fabricating the semiconductor device and do not increase the manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first insulating layer over a substrate;
a contact plug in the first insulating layer and in contact with a surface of the substrate;
a capacitor structure above the contact plug, wherein the capacitor structure includes a conductive layer over the first insulating layer;
a second insulating layer over the first insulating layer, wherein the second insulating layer covers the capacitor structure; and
a capacitor contact over the capacitor structure, wherein the capacitor contact comprises:
a first contact portion penetrating through the second insulating layer and extending into the conductive layer of the capacitor structure, wherein the first contact portion comprises a lower portion in contact with the conductive layer of the capacitor structure; and
a second contact portion connecting an outer surface of the first contact portion and surrounding the lower portion of the first contact portion, wherein the second contact portion extends outwardly from the lower portion of the first contact portion.

2. The semiconductor device as claimed in claim 1, wherein an area surrounded by sidewalls of the second contact portion is greater than an area surrounded by sidewalls of the first contact portion as viewed from a top side of the substrate.

3. The semiconductor device as claimed in claim 1, wherein a bottom surface of the first contact portion is lower than a top surface of the conductive layer of the capacitor structure.

4. The semiconductor device as claimed in claim 1, wherein the second contact portion is formed on the conductive layer of the capacitor structure.

5. The semiconductor device as claimed in claim 4, wherein the second insulating layer comprises:
a first oxide layer on the conductive layer; and
a second oxide layer on the first oxide layer,
wherein there is an etch selectivity between the first oxide layer and the second oxide layer.

6. The semiconductor device as claimed in claim 5, wherein a top surface of the second contact portion is level with a top surface of the first oxide layer of the second insulating layer.

7. The semiconductor device as claimed in claim 1, wherein the second contact portion is positioned within the conductive layer of the capacitor structure.

8. The semiconductor device as claimed in claim 1, wherein a top surface of the second contact portion is level with a top surface of the conductive layer of the capacitor structure.

9. The semiconductor device as claimed in claim 1, wherein a bottom surface of the first contact portion is misaligned with a bottom surface of the second contact portion.

10. The semiconductor device as claimed in claim 1, wherein a bottom surface of the first contact portion is coplanar with a bottom surface of the second contact portion.

11. The semiconductor device as claimed in claim 1, comprising a plurality of capacitor contacts, wherein adjacent second contact portions of the capacitor contacts are separated from each other by a distance.

12. The semiconductor device as claimed in claim 1, comprising a plurality of capacitor contacts, wherein adjacent second contact portions of the capacitor contacts are connected to each other.

13. The semiconductor device as claimed in claim 1, comprising:
a plurality of capacitor contacts arranged in rows, wherein the first contact portions of two adjacent capacitor contacts arranged in the same row are spaced apart by a first pitch, the first contact portions of two adjacent capacitor contacts arranged in different rows are spaced apart by a second pitch, and the first pitch is less than the second pitch,
wherein the second contact portions of the capacitor contacts that are arranged in the same row are connected to each other.

14. The semiconductor device as claimed in claim 1, wherein the capacitor contact is referred to as a first contact in an array region of the substrate, and the semiconductor device further comprises:
a second contact in a peripheral region of the substrate, wherein the second contact penetrates through the second insulating layer and is electrically connected to a metal contact trace in the peripheral region.

15. A method of manufacturing a semiconductor device, comprising:
providing a substrate and forming a memory cell plate over the substrate, wherein the memory cell plate comprises:
a first insulating layer over the substrate;

a contact plug in the first insulating layer and in contact with a surface of the substrate; and a capacitor structure above the contact plug, wherein the capacitor structure includes a conductive layer over the first insulating layer;

forming a second insulating layer over the first insulating layer, wherein the second insulating layer covers the memory cell plate; and forming a capacitor contact over the capacitor structure, wherein the capacitor contact comprises:

a first contact portion penetrating through the second insulating layer and extending into the conductive layer of the capacitor structure, wherein the first contact portion comprises a lower portion in contact with the conductive layer of the capacitor structure; and a second contact portion connecting an outer surface of the first contact portion and surrounding the lower portion of the first contact portion, wherein the second contact portion extends outwardly from the lower portion of the first contact portion.

16. The method of manufacturing a semiconductor device as claimed in claim 15, wherein forming the second insulating layer comprises:

forming a first oxide layer on the memory cell plate; and forming a second oxide layer on the first oxide layer, wherein there is an etch selectivity between the first oxide layer and the second oxide layer.

17. The method of manufacturing a semiconductor device as claimed in claim 16, further comprising simultaneously patterning a first oxide material and a conductive material to form the first oxide layer and the conductive layer, respectively.

18. The method of manufacturing a semiconductor device as claimed in claim 16, wherein forming the capacitor contact comprises:

forming a pattern transfer layer over the conductive layer of the capacitor structure;

forming a patterned mask layer over the pattern transfer layer;

transferring a pattern of the patterned mask layer to the pattern transfer layer;

removing portions of the second insulating layer to form first contact holes in the second insulating layer by using the patterned pattern transfer layer as a mask, wherein the first contact holes penetrate the second oxide layer and the first oxide layer, and bottom surfaces of the first contact holes expose the conductive layer;

performing a selective etching process through the first contact hole to remove portions of the first oxide layer, so as to form an air cavity from the lower portion of the first contact hole, wherein the air cavity surrounds and communicates with the lower portion of the first contact hole; and filling a conductive composite material into the first contact hole and the air cavity.

19. The method of manufacturing a semiconductor device as claimed in claim 15, wherein the second insulating layer is in contact with the conductive layer of the capacitor structure.

20. The method of manufacturing a semiconductor device as claimed in claim 19, wherein forming the capacitor contact comprises:

forming a pattern transfer layer over the conductive layer of the capacitor structure;

forming a patterned mask layer over the pattern transfer layer;

transferring a pattern of the patterned mask layer to the pattern transfer layer;

removing portions of the second insulating layer to form first contact holes in the second insulating layer by using the patterned pattern transfer layer as a mask, wherein bottom surfaces of the first contact holes expose the conductive layer;

performing a selective etching process through the first contact hole to remove portions of the first oxide layer, so as to remove a portion of the conductive layer and form an air cavity from the lower portion of the first contact hole, wherein the air cavity surrounds the lower portion of the first contact hole, and the air cavity communicates with the first contact hole; and filling a conductive composite material into the first contact hole and the air cavity.

* * * * *